United States Patent [19]

Awazu et al.

[11] Patent Number: 5,030,615
[45] Date of Patent: Jul. 9, 1991

[54] METHOD FOR PRODUCING THALLIUM OXIDE SUPERCONDUCTOR

[75] Inventors: Tomoyuki Awazu; Hideo Itozaki; Naoji Fujimori; Shuji Yazu, all of Hyogo, Japan

[73] Assignee: Sumitomo Electric Industries, Ltd., Osaka, Japan

[21] Appl. No.: 380,311

[22] Filed: Jul. 17, 1989

[30] Foreign Application Priority Data

Jul. 15, 1988 [JP] Japan .................................. 63-176366

[51] Int. Cl.$^5$ ............................................. H01L 39/12
[52] U.S. Cl. .......................................... 505/1; 264/65;
505/725
[58] Field of Search ....................... 264/65; 505/1, 783, 505/725

[56] References Cited

U.S. PATENT DOCUMENTS 4,870,052 9/1989 Engler et al. ...................... 501/123

OTHER PUBLICATIONS

Torardi et al., "Crystal Superconductor" *Science* (Apr. 1988).
Sheng et al., "Superconductivity System" *Physical Review* (Recd. 6/9/88).

*Primary Examiner*—Jan H. Silbaugh
*Assistant Examiner*—Christopher A. Fiorilla
*Attorney, Agent, or Firm*—Kerkam, Stowell, Kondracki & Clarke

[57] ABSTRACT

Improvement in a method for producing superconductors of thallium (Tl) type compound oxides by sintering a material powder mixture including at least one thallium-containing powder, the method including wrapping the material powder mixture in a foil of precious metals or their alloys and placing the wrapped material powder in a pipe of precious metals or their alloys and having an opening, wherein the material powder mixture wrapped in the foil is sintered in the pipe while oxygen gas is supplied into the pipe through the opening.

15 Claims, 4 Drawing Sheets

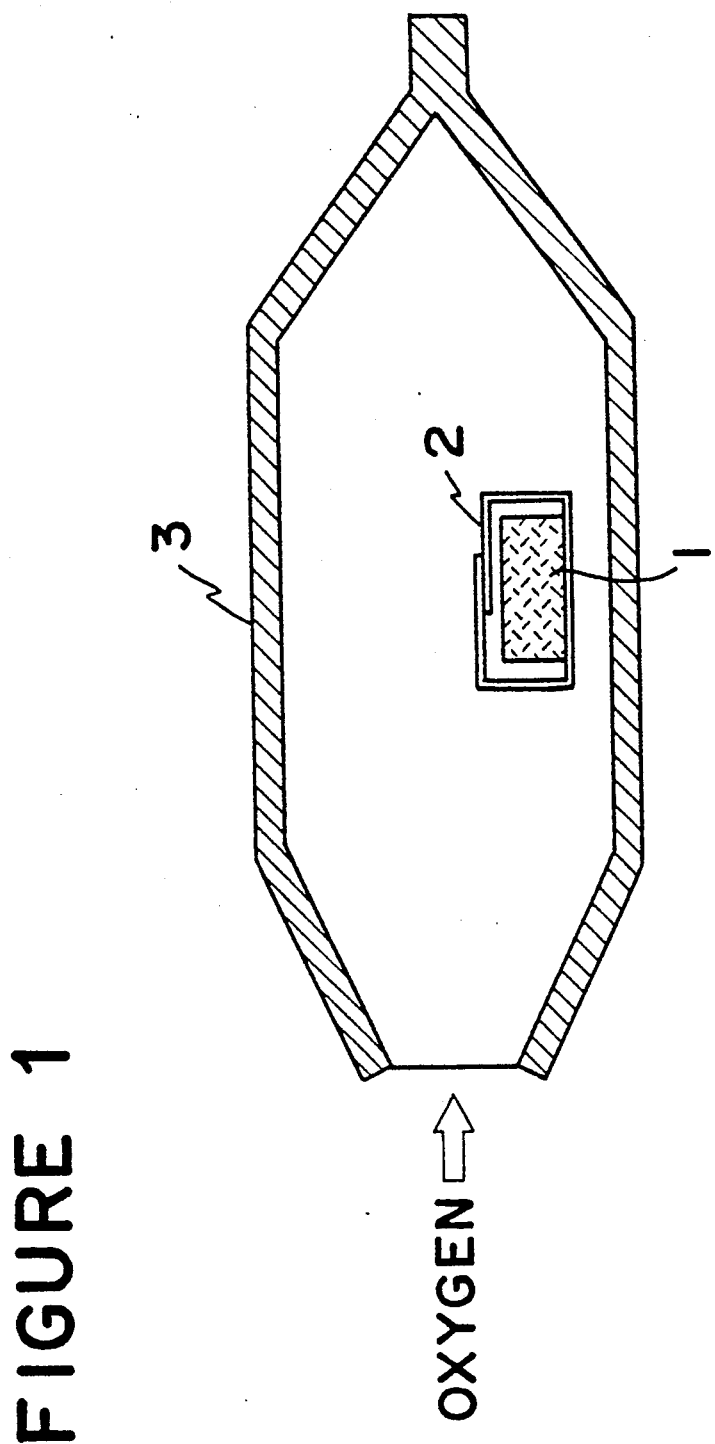

METHOD FOR PRODUCING THALLIUM OXIDE SUPERCONDUCTOR

BACKGROUND OF THE INVENTION

1. Field of the Invention

The present invention relates to an improvement in a method for producing thallium type superconductors. More particularly, it relates to a method for producing superconducting compound oxides containing thallium (Tl), such as a Tl—Ba—Ca—Cu type oxide, which have a high critical temperature.

2. Description of the Related Art

Superconductivity is a phenomenon which is described as a kind of phase change of electrons under which an electric resistance becomes zero and perfect diamagnetism is observed. When superconductor technology is applied to electric power transmission, power loss of about 7%, which is experienced in electric power transmission systems today, can be greatly reduced. Development of superconductor technology is also expected in the field of measurement and in the field of medical treatment such as NMR, $\pi$ neutron medical treatment or high-energy physical experiments. In electromagnet devices for generating strong magnetic fields, superconductor technology is expected to accelerate development of the technology of fusion power generation, MHD power generation, magnetic levitation trains and magnetically propelled ships.

The critical temperature "Tc" of superconductors, however, had not exceeded 23.2K exhibited in $Nb_3Ge$ which was the highest Tc reported over the past ten years.

The existence of new types of superconducting materials having much higher Tc was revealed by Bednorz and Müller, who discovered a new oxide type superconductor in 1986 (Z. Phys. B64, 1986 p. 189).

The new compound oxide type superconductor discovered by Bednorz and Müller is represented by [La, Sr]$_2$CuO$_4$, which is referred to as a $K_2NiF_4$-type oxide, having a crystal structure which is similar to known perovskite type oxides. The $K_2NiF_4$-type compound oxides have exhibited a higher Tc on the order of 30K which are much higher than previously known superconducting materials.

It was also reported in February 1987 that C. W. Chu et al. discovered, in the United States of America, another superconducting material of the so called YBCO type represented by $YBa_2Cu_3O_{7-x}$ having a critical temperature of about 90K (Physical Review letters, Vol. 58, No. 9, p. 908).

Other new superconducting materials have been reported recently, such as a compound oxide of a Bi—Sr—Ca—Cu—O system reported by Maeda et al (Japanese Journal of Applied Physics. Vol. 27, No. 2, p. 1209 to 1210) and a Tl—Ba—Ca—Cu—O system, which exhibit a Tc in excess of 100K (Hermann et al. Appl. Phys. Lett. 52 (20) p. 1738) and which are chemically more stable than the abovementioned YBCO type compound oxide or the like. Hence, the possibility of actual utilization of the high Tc superconductors has burst onto the scene.

A variety of compound oxides which show high critical temperatures have subsequently been reported. Among them, thallium (Tl) type compound oxides have the significant advantage that high Tc superconductors having a $T_c$ higher than 100K can be realized without using rare earth elements as a material, so that the production cost can be reduced.

The above-mentioned oxide type superconducting materials can be prepared in a bulk form as a sintered block obtained by sintering a powder mixture of oxides or carbonates of constituent metal elements, or can be deposited on a substrate in the form of a thin film by a physical vapor deposition (PVD) technique or a chemical vapor deposition (CVD) technique.

In the case of production of thallium type oxide superconductors, however, there is a special problem because thallium (Tl) is a very volatile element and toxic to humans. Therefore, it is necessary to adopt a special sintering technique when the thallium type compound oxides are produced by sintering a material powder mixture.

Heretofore, when the material powder mixture for thallium type compound oxides have been sintered, it has been usual practice to wrap the material powder mixture in a foil made of gold in order to prevent volatile thallium vapour from escaping. However, it has proven to be difficult to completely suppress the escape of thallium vapour out of the gold foil, so that the atomic ratios of the component elements in the resulting sintered mass will deviate from desired values. In fact, it is difficult to produce a sintered mass having consistent quality and a stable high-value $T_c$ by this process.

It has also been proposed to carry out the sintering of material powder mixture for the thallium type compound oxides in a pipe made of gold ("Science" vol. 240, page 631 to 634, Apr. 4, 1988). As a variation, it has been proposed to sinter the material powder mixture wrapped in a gold foil in a sealed pipe made of quartz [Report submitted to "Phys. Review Letter" by S. S. P. Parkin et al. RJ 6147 (60857) 3/18/88].

These methods, however, have the problem that oxygen supply to the material powder mixture during the sintering operation is impossible or difficult, so that the oxygen content in the resulting sintered mass will be insufficient. In fact, the products obtained by these methods show rather poor superconducting property. Further, there is a danger of breakage of the pipe if the pipe is sealed in an air-tight manner.

An object of the present invention is to overcome the problem exhibited in the prior art process and to provide an improved method for producing thallium (Tl) type compound oxide superconductors.

SUMMARY OF THE INVENTION

The present invention provides an improved method for producing superconductors of thallium (Tl) type compound oxide by sintering a material powder mixture including at least one powder containing thallium (Tl).

According to the present invention, the material powder mixture is wrapped by a metallic foil made of a precious metal or an alloy of precious metal and is placed in a metallic pipe which has an opening, and the material powder mixture wrapped in the foil is then fired or sintered while oxygen gas is supplied into the metallic pipe through the opening, so that the material powder mixture wrapped in the metallic foil is sintered in an oxygen gas atmosphere.

The process of the present invention is applicable to any superconductor composed of compound oxide containing thallium (Tl). One of the typical thallium type compound oxides is represented by the general formula:

$Tl_4(Ca_{1-x},Ba_x)_mCu_nO_{p+y}$ in which m, n, x and y are numbers each satisfying the ranges of $6 \leq m \leq 16$, $4 \leq n \leq 12$, $0.2 < x < 0.8$, and $-2 \leq y \leq +2$, respectively and $p = (6+m-n)$ such as $Tl_4Ca_4Ba_4Cu_6O_{20+y}$ or $Tl_2Ca_2Ba_2Cu_3O_{10+y}$.

Examples of other thallium-containing compound oxide systems to which the present invention is applicable are (critical temperatures noted in parentheses):
Tl—Sr—Ca—Cu—O system (75 to 100K),
Tl—Pb—Sr—Ca—Cu—O system (80 to 122K),
Tl—Ba—(Y, Ca)—Cu—O system (92K),
(Tl, Ln)—Sr—Ca—Cu—O system (80 to 90K),
(Tl, La, Pb)—Sr—Ca—O system (100K),
(Bi, Tl)—Sr—Cu—O system (90K),
Pb—Tl—Sr—Cu—O system (42K),
La—Tl—Sr—Cu—O system (37K) and
Nd—Tl—Sr—Cu—O system (44K).

(note) Ln: lanthanoid

The metallic foil is preferably made of gold (Au), platinum (Pt) or their alloys. The metallic pipe is preferably made of silver (Ag), gold (Au), platinum (Pt) or their alloys.

The sintering operation can be effected in an ordinary furnace. The interior of the furnace is preferably in the condition of an oxygen-rich atmosphere, but, according to the present invention, the sintering can be carried out in a normal air atmosphere.

According to the present invention, oxygen gas is fed continuously into the metallic pipe during the sintering operation. The oxygen gas is supplied preferably at a rate of more than 0.1 liter per minute at 1 atm. Usually, the oxygen gas pressure can be about at ambient pressure (1 atm). The sintering can be effected also at a higher oxygen pressure than 1 atm.

The sintering is effected at a temperature between 880° and 920° C. When the sintering temperature is not higher than 880° C., the resulting sintered mass becomes a mixture of different phases each having a different critical temperature, so that the overall Tc of the sintered mass becomes lower. To the contrary, if the sintering temperature is not lower than 920° C., the evaporation of thallium (Tl) increases excessively making it difficult to adjust the composition of the sintered mass to the desired atomic ratios, and increasing precipitates which do not contribute to the superconductivity of the material.

The sintering can be effected for a time duration between 1 minute and 40 hours, preferably between 1 and 40 hours. When the sintering time is not longer than 1 minute, the material powder mixture is not sintered satisfactorily and a desired superconductive material will not be obtained. A sintering time longer than 40 hours may not generally be effective in improving the superconducting property.

The material powder mixture can be a mixture of powders selected from a group comprising elemental powders of constituent elements (Tl, Ba, Ca, Cu etc), oxide powders ($Tl_2O_3$, CaO, BaO, CuO etc) containing at least one constituent element of the compound oxide or carbonate powders ($Tl_2(CO_3)_3$, $Ca(CO_3)_3$, $Ba(CO_3)_3$, etc). The material powder mixture is preferably pressed into a compact before the material powder mixture is wrapped in the metallic foil.

The method according to the present invention has the following merits:

(1) It is possible to adjust the atomic ratio of thallium in the compound oxide to a desired value, because the evaporation of volatile thallium is suppressed by the metallic foil and by the surrounding oxygen gas.

(2) It is also possible to adjust the oxygen content in the compound oxide to a desired value because the sintering operation is carried out in oxygen-rich condition.

(3) The sintered mass is not contaminated by the wrapping foil because the foil is made of precious metal which is not reactive with the material powder.

In conclusion, according to the method of the present invention, it becomes possible to produce high-quality superconductors of thallium-containing compound oxides such as the Tl—Ba—Ca—Cu type oxide superconductors which have improved superconducting properties, particularly high values of and stable condition of the critical temperature (Tc).

The method according to the present invention is described with reference to FIG. 1 which illustrates one embodiment of how to carry out the present method.

BRIEF DESCRIPTION OF THE DRAWINGS

FIG. 1 is a drawing illustrating a substantially schematic cross section of an apparatus for carrying out the present method.

DETAILED DESCRIPTION OF THE PREFERRED EMBODIMENTS

The material powder mixture 1 is wrapped in a metallic foil 2 made of precious metal to prepare a package. This package is placed in a metallic pipe 3 made of precious metal and having a closed end and an opening at an opposite end. Then, the metallic pipe 3 is placed in a furnace (not shown). While oxygen gas is fed by a nozzle (not shown) through the opening of the pipe 3, the temperature of the furnace is elevated gradually to a predetermined sintering temperature which is maintained for a predetermined time duration which is necessary to sinter the material powder mixture.

The method according to the present invention will be described by the following examples. However, the scope of the present invention is not to be limited to the following specific examples.

EXAMPLE 1

Powders of $BaCO_3$ and CuO are kneaded in a mortar and the resulting powder mixture is sintered preliminarily at 900° C. for 8 hours. The resulting sintered mass is pulverized into a powder to which powders of $Tl_2O_3$ and CaO are admixed uniformly to prepare a material powder mixture. The atomic ratios of Tl:Ca:Ba:Cu in the material powder mixture are adjusted to 2.4:2.3:2.0:3.0.

The material powder mixture is pressed to a compact which is then wrapped in a foil made of gold (Au). The compact wrapped in the gold foil is then placed in a pipe made of silver (Ag) having a closed end and an opening at an opposite end.

After the silver pipe containing the wrapped compact is set in a sintering furnace, oxygen gas is supplied into the silver pipe through the opening and the temperature of the sintering furnace is elevated to 905° C. Sintering is effected for 3 hours.

Figure 2A:
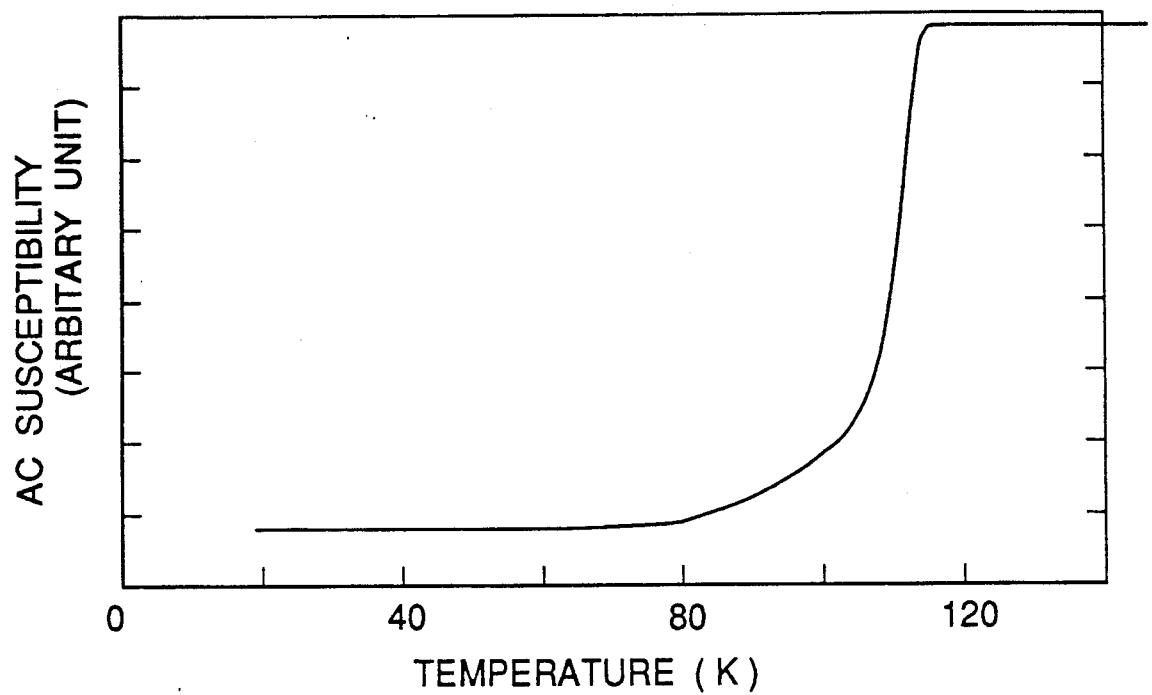
FIG. 2A is a graph showing a temperature dependency of the AC susceptibility of a superconductor produced according to the present invention.

FIG. 2A shows a temperature dependency of the AC susceptibility of a superconductor of Example 1 according to the present invention. From FIG. 2A, is is apparent that the superconductor produced according to the present invention exhibits a very sharp curve which means that the superconductor consists of only a high Tc phase.

The critical temperature (Tc at resistance R=0) of Example 1 determined by conventional four probe method is 120K.

COMPARATIVE EXAMPLE 1

As a comparative example 1, a compact which is prepared by the same method as Example 1 is wrapped in a gold foil and is sintered in the same sintering furnace at 905° C. for 3 hours.

In this case, however, the wrapped compact is sintered directly in the oxygen gas stream without using the silver pipe.

Figure 2B:
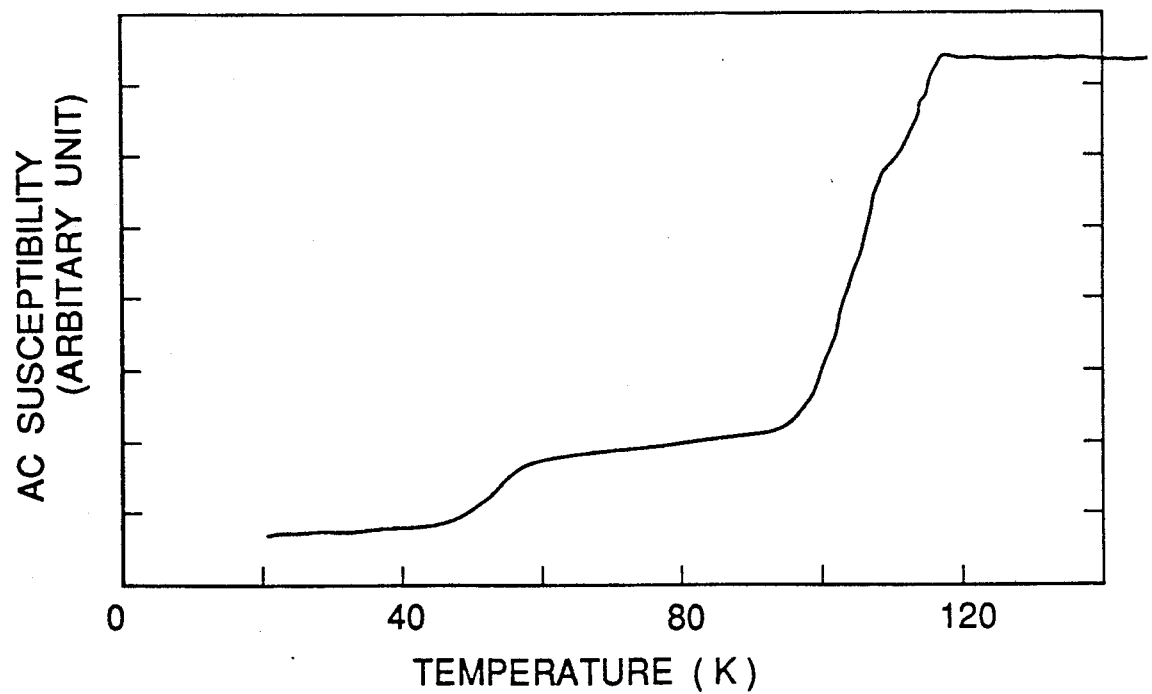
FIG. 2B is a graph showing a temperature dependency of the AC susceptibility of a superconductor produced according to one of prior arts.

FIG. 2B shows a temperature dependency of the AC susceptibility of a superconductor of the Comparative Example produced by the conventional method. The curve of FIG. 2B is not smooth and has a stepped portion which is caused by the presence of a lower Tc phase in the sintered mass.

COMPARATIVE EXAMPLE 2

As a comparative example 2, a compact which is prepared by the same method as Example 1 is wrapped in a gold foil and the resulting wrapped compact is placed in a silver pipe.

In this case, however, opposite ends of the silver pipe are closed in an air tight manner. Sintering is effected in the same sintering furnace as Example 1 at 905° C. for 3 hours in oxygen gas stream.

The critical temperature (Tc at resistance R=0) of this Comparative Example 2 determined by conventional four probe method is 109K.

EXAMPLE 2 TO 5

Example 1 is repeated to prepare the material powder mixture except the atomic ratios of Tl:Ca:Ba:Cu in the material powder mixture are modified as follows:

Example 2: Tl:Ca:Ba:Cu=2.4:2.3:2.0:3.0
Example 3: Tl:Ca:Ba:Cu=3.6:2.3:2.0:3.0
Example 4: Tl:Ca:Ba:Cu=4.9:2.3:2.0:3.0
Example 5: Tl:Ca:Ba:Cu=1.2:3.5:1.0:3.0

Each compact is wrapped in gold (Au) foil. The compact wrapped by the gold foil is then placed in a pipe made of silver (Ag) having a closed end and an opening at an opposite end.

After the silver pipe containing the wrapped compact is set in a sintering furnace, oxygen gas is supplied into the silver pipe through the opening and the temperature of the sintering furnace is elevated. Sintering is effected under different conditions.

Figure 3:
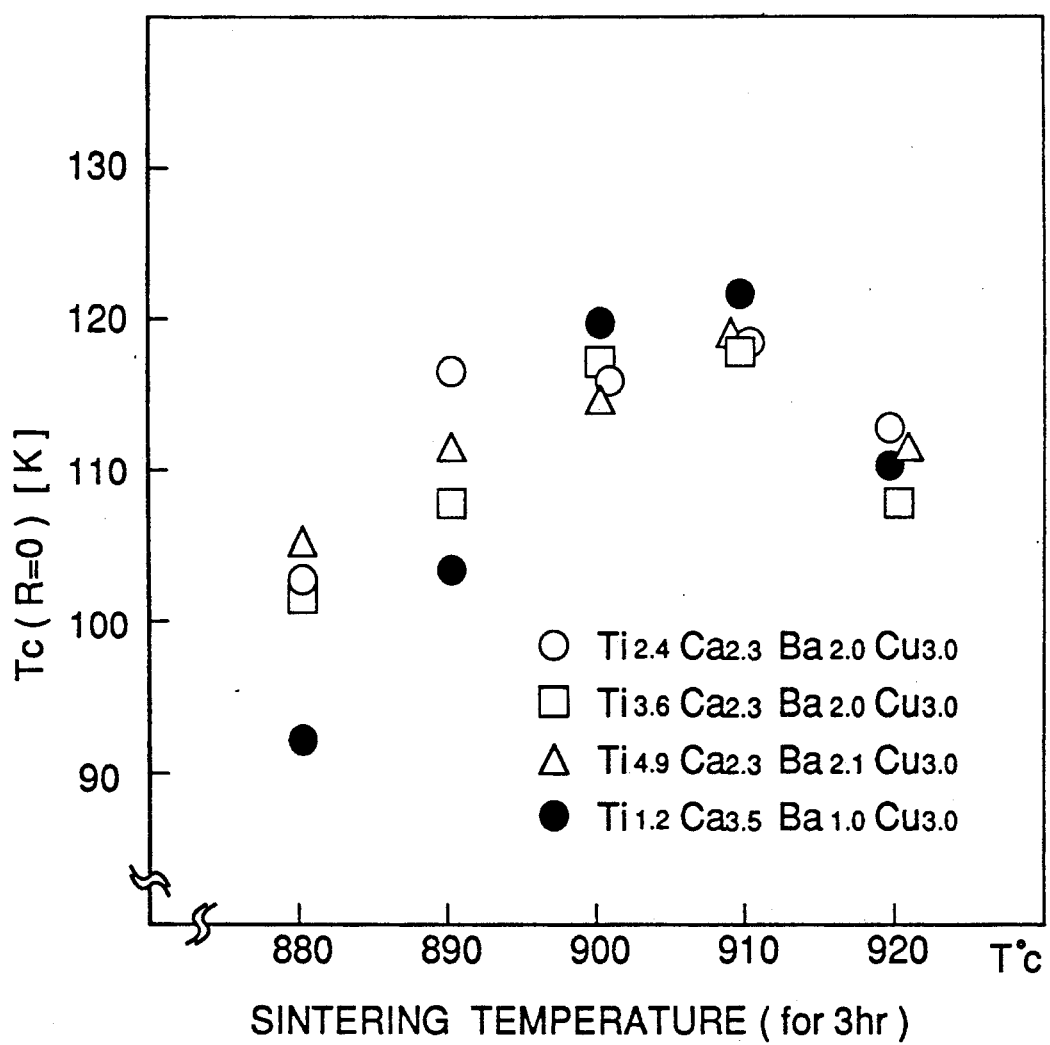
FIG. 3 is a graph showing critical temperatures (Tc) (resistance R=0) measured on four different compositions when the sintering temperature (T: ° C.) is varied.

FIG. 3 shows the relationships between Tc (resistance R=0) of the superconductors of Example 2 to 5 and the sintering temperature when the sintering time is fixed at 3 hours.

Figure 4:
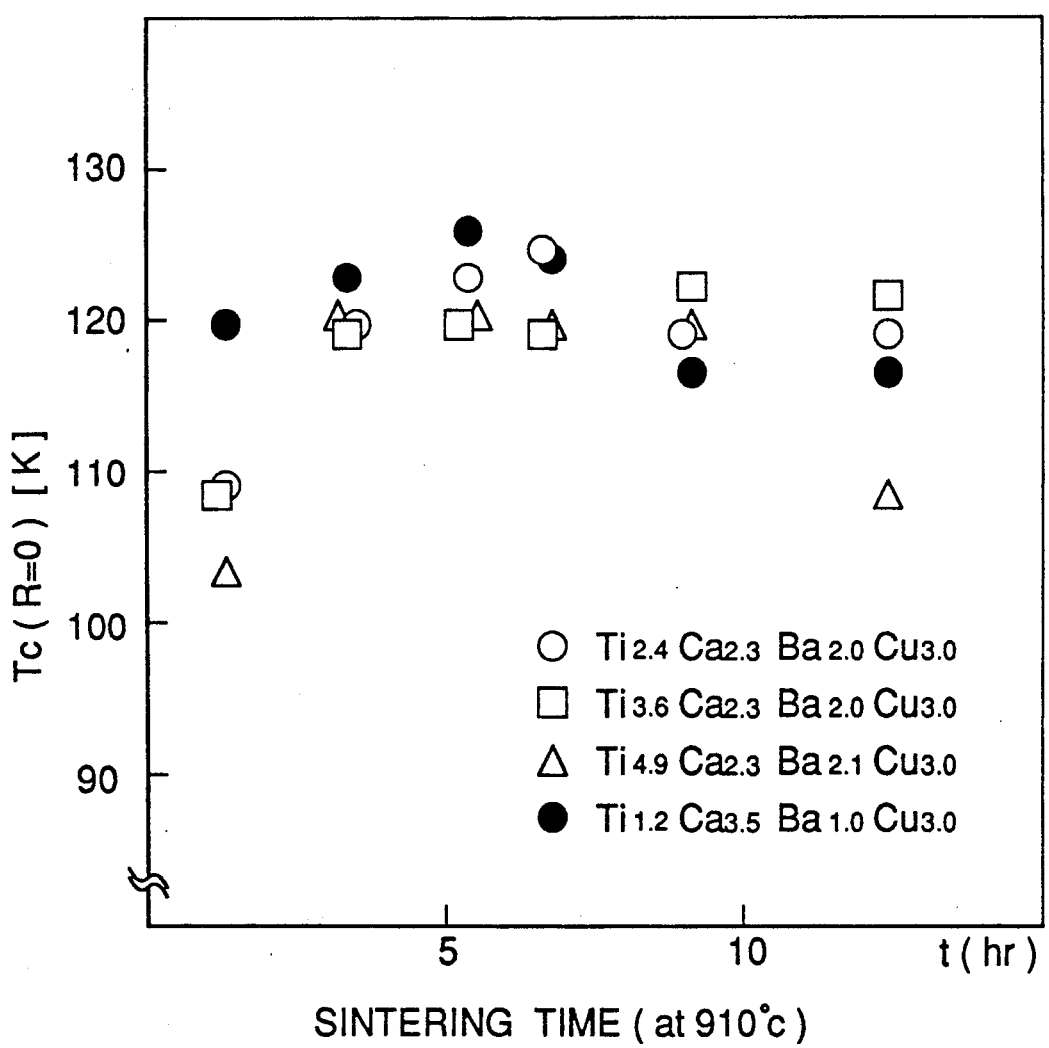
FIG. 4 is a graph showing critical temperatures (Tc) (resistance R=0) measured on the four different compositions when the sintering time (t: hr) is varied.

FIG. 4 shows the relationships between Tc (resistance R=0) of the superconductors of Example 2 to 5 and the sintering time when the sintering temperature is fixed at 910° C.

A superconductor obtained from the compact of Example 5 (Tl:Ca:Ba:Cu=1.2:3.5:1.0:3.0) which is sintered at 910° C. for 5 hours shows the highest Tc of 125K.

Another superconductor obtained from the compact of Example 2 (Tl:Ca:Ba:Cu=2.4:2.3:2.0:3.0) which is sintered at 910° C. for 6 hours also shows a very high Tc of 124K.

We claim:

1. In a method for producing superconductors of thallium (Tl) type compound oxide by sintering a material powder mixture including at least one thallium-containing powder, the improvement comprising wrapping said material powder mixture in a metallic foil made of precious metals or their alloys, placing the material powder mixture wrapped in the metallic foil in a metallic pipe made of precious metals or their alloys and having an opening, and then firing said metallic pipe while oxygen gas is supplied into the metallic pipe through the opening so that the material powder mixture wrapped in the metallic foil is sintered.

2. The method according to claim 1 wherein said metallic foil is made of gold (Au), platinum (Pt) or their alloys.

3. The method according to claim 1 wherein said metallic pipe is made of silver (Ag), gold (Au), platinum (Pt) or their alloys.

4. The method according to claim 1 wherein the oxygen is supplied at a rate of more than 0.1 liter per minute during the sintering operation.

5. The method according to claim 1 wherein the material powder mixture is a mixture of powders selected from the group consisting of elemental powders of constituent elements of the compound oxide, oxide powders containing at least one of constituent elements of the compound oxide and carbonate powders containing at least one of constituent elements of the compound oxide.

6. The method according to claim 1 wherein the material powder mixture is compacted by a press before the material powder mixture is wrapped by the metallic foil.

7. The method according to claim 1 wherein the sintering is effected at a temperature between 880° and 920° C.

8. The method according to claim 1 wherein the sintering is effected for a time duration between 1 minute and 40 hours.

9. The method according to claim 1 wherein said superconductors of thallium (Tl) type compound oxide are represented by the general formula:

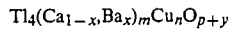

$$Tl_4(Ca_{1-x}Ba_x)_m Cu_n O_{p+y}$$

in which m, n, x and y are numbers each satisfying ranges of $6 \leq m \leq 16$, $4 \leq n \leq 12$, $0.2 < x < 0.8$ and $-2 \leq y \leq +2$, respectively and $p=(6+m+n)$.

10. The method according to claim 9 wherein said metallic foil is made of gold (Au), platinum (Pt) or their alloys and said metallic pipe is made of silver (Ag), gold (Au), platinum (Pt) or their alloys.

11. The method according to claim 9 wherein the oxygen is supplied at a rate of more than 0.1 liter per minute during the sintering operation.

12. The method according to claim 9 wherein the material powder mixture is a mixture of powders each selected from a group comprising elemental powders of constituent elements of the compound oxide, oxide powders containing at least one of constituent elements of the compound oxide and carbonate powders containing at least one of constituent elements of the compound oxide.

13. The method according to claim 9 wherein the material powder mixture is compacted by a press before the material powder mixture is wrapped by the metallic foil.

14. The method according to claim 9 wherein the sintering is effected at a temperature between 880° and 920° C. for a time duration between 1 minute and 40 hours.

15. An improved method for producing superconductor material of thallium (Tl) type compound oxide from a material powder mixture including at least one thallium-containing powder comprising:
wrapping said material powder mixture in a metallic foil made of precious metals or an alloy of precious metals;
placing said wrapped material powder mixture in a metallic pipe, said pipe being made of precious metals or an alloy of precious metals, said pipe having an opening therein;
heating said material powder mixture contained in said metallic pipe to a temperature sufficient to effect sintering of the material powder mixture; and
supplying oxygen gas into said metallic pipe through said opening therein while said material powder mixture is heated and sintered.

* * * * *